US011853759B2

(12) United States Patent
Yang

(10) Patent No.: US 11,853,759 B2
(45) Date of Patent: Dec. 26, 2023

(54) NEURAL NETWORK ACCELERATOR WITH TYPE CONVERSION UNITS AND OPERATING METHOD THEREOF

(71) Applicant: ELECTRONICS AND TELECOMMUNICATIONS RESEARCH INSTITUTE, Daejeon (KR)

(72) Inventor: Jeongmin Yang, Daejeon (KR)

(73) Assignee: ELECTRONICS AND TELECOMMUNICATIONS RESEARCH INSTITUTE, Daejeon (KR)

(*) Notice: Subject to any disclaimer, the term of this patent is extended or adjusted under 35 U.S.C. 154(b) by 147 days.

(21) Appl. No.: 17/459,935

(22) Filed: Aug. 27, 2021

(65) Prior Publication Data

US 2022/0137963 A1 May 5, 2022

(30) Foreign Application Priority Data

Nov. 2, 2020 (KR) .......................... 10-2020-0144519
Jul. 20, 2021 (KR) .......................... 10-2021-0094528

(51) Int. Cl.
*G06F 9/30* (2018.01)
*G06F 15/80* (2006.01)
*G06F 7/544* (2006.01)
*H03M 7/30* (2006.01)

(52) U.S. Cl.
CPC .......... *G06F 9/3004* (2013.01); *G06F 7/5443* (2013.01); *G06F 9/30025* (2013.01); *G06F 15/80* (2013.01); *H03M 7/70* (2013.01)

(58) Field of Classification Search
CPC ...... G06F 9/30025; G06F 15/80; G06N 3/063
See application file for complete search history.

(56) References Cited

U.S. PATENT DOCUMENTS

| 10,373,050 | B2 | 8/2019 | Lin et al. |
| 11,182,668 | B2* | 11/2021 | Martin ................... G06N 3/063 |
| 11,244,225 | B2* | 2/2022 | Brothers ............... G06F 9/3017 |
| 11,507,370 | B2* | 11/2022 | Zhang .................... G06N 20/00 |

(Continued)

FOREIGN PATENT DOCUMENTS

| KR | 20190030564 A | 3/2019 |
| KR | 20200011362 A | 2/2020 |
| KR | 20200111106 A | 9/2020 |

*Primary Examiner* — Jacob Petranek

(57) ABSTRACT

Disclosed are a neural network accelerator and an operating method thereof, which include an instruction analyzer that analyzes a first instruction instructing an operation with respect to a first layer of a neural network algorithm from an external device, a polymorphic operator array including a plurality of operators that performs the operation with respect to the first layer under a control of the instruction analyzer, an interface that communicates with the external device and an external memory under the control of the instruction analyzer, an internal memory, a type converter, a type conversion data mover that stores data received from the external memory through the interface in the internal memory under the control of the instruction analyzer, and an internal type converter that performs a conversion of data stored in the internal memory or data generated by the polymorphic operator array under the control of the instruction analyzer.

12 Claims, 7 Drawing Sheets

(56) References Cited

U.S. PATENT DOCUMENTS

| | | |
|---|---|---|
| 2017/0372202 A1 | 12/2017 | Ginsburg et al. |
| 2018/0322382 A1 | 11/2018 | Mellempudi et al. |
| 2020/0167632 A1* | 5/2020 | Kim ................... G06F 7/4876 |
| 2020/0210838 A1* | 7/2020 | Lo ........................ G06N 3/084 |
| 2020/0302291 A1 | 9/2020 | Hong |
| 2022/0066660 A1* | 3/2022 | Kim ................... G06F 3/0626 |

* cited by examiner

FIG. 3

○ 10-bit Adder  △ 10-bit Multiplier
○ 5-bit Adder   △ 4-bit Multiplier

| Data Type | Total Number of Bits | Sign | Exponent | Mantissa | Addition | Multiplication Addition | Multiplication |
|---|---|---|---|---|---|---|---|
| FP16 | 16 | 1 | 5 | 10 | ⑩ | ⑤ | △10 |
| HFP8 | 8 | 1 | 5 | 2 | ②̣ | ⑤̣ | △̣2 |
| INT2 | 2 | | | 2 | ②̣ | | △̣2 |
| INT4 | 4 | | | 4 | ④̣ | | △̣4 |
| INT8 | 8 | | | 8 | ⑧ | | △8 |

NEURAL NETWORK ACCELERATOR WITH TYPE CONVERSION UNITS AND OPERATING METHOD THEREOF

CROSS-REFERENCE TO RELATED APPLICATIONS

This application claims priority under 35 U.S.C. § 119 to Korean Patent Application Nos. 10-2020-0144519, filed on Nov. 2, 2020, and 10-2021-0094528, filed on Jul. 20, 2021, respectively, in the Korean Intellectual Property Office, the disclosures of which are incorporated by reference herein in their entireties.

BACKGROUND

Embodiments of the present disclosure described herein relate to a multi-precision neural network accelerator and a method of operating the same.

Although artificial intelligence (AI) semiconductor design technologies that mimics the human brain have a history of several decades, it is in a stagnant state due to a limitation of a computational amount of existing silicon-based semiconductors. A neural network, which models the neural transfer of neurons through a process of learning weights for input values, has been proposed a long time ago, but has not received much attention due to limitations of semiconductor technology. However, with the continuous refinement and advancement of semiconductor processes in recent years, artificial intelligence semiconductor design technologies and neural network models are in the spotlight again.

Artificial intelligence semiconductors implement thoughts and reasoning, and actions and operations optimized for a specific service by using a large amount of input information. As the concept of multi-layer perceptron (MLP) and neural network circuits are introduced in this artificial intelligence semiconductor technology, application fields of artificial intelligence technology are diversifying and varying. In fields such as devices for intelligent personal services (mobile devices, intelligent smartphones, etc.), autonomous vehicles (autonomous vehicles, autonomous drones, goods transport), server-type deep learning accelerators, intelligent healthcare (artificial intelligence doctors, telemedicine, wearable health) care devices), military equipment (unmanned aerial vehicles, detection robots), social services (financial-prediction services, crime surveillance), etc., technological innovation by artificial intelligence is expected to be applied almost everywhere in the field of ICT materials and parts.

An artificial intelligence computer utilizes a distributed computing technique based on a large number of CPUs and GPUs to improve performance. However, the increase in the amount of computation required for artificial intelligence computing is out of the range of the amount of computation that CPU and GPU-based architectures can handle. Artificial intelligence applied with deep learning requires more than 1000 times the performance of current mobile processors. Products manufactured to implement this performance consume more than several kilowatts (KW) of power, so it is difficult to commercialize. Furthermore, semiconductor devices currently face physical limitations with respect to process scaling.

In response to the increased amount of computation, a super-parallel GPU structure in which a graphics processing unit (GPU) is advanced and an accelerator structure dedicated to neural network computation have been proposed. Such structures may be structures for accelerating multidimensional matrix multiplication and convolution operations, which occupy a high proportion in neural network operations.

SUMMARY

Embodiments of the present disclosure provide a neural network accelerator supporting a multi-precision, which provides an efficient matrix convolution operation, and a method of operating the same.

According to an embodiment of the present disclosure, a neural network accelerator includes an instruction analyzer that analyzes a first instruction instructing an operation with respect to a first layer of a neural network algorithm from an external device, a polymorphic operator array including a plurality of operators that performs the operation with respect to the first layer under a control of the instruction analyzer, an interface that communicates with the external device and an external memory under the control of the instruction analyzer, an internal memory, a type conversion data mover that stores data received from the external memory through the interface in the internal memory under the control of the instruction analyzer, and an internal type converter that performs a conversion of data stored in the internal memory or data generated by the polymorphic operator array under the control of the instruction analyzer.

According to an embodiment of the present disclosure, a method of operating a neural network accelerator including a polymorphic operator array that performs operations for processing a neural network algorithm, an internal memory, a type conversion data mover that transfers data stored in an external memory to the internal memory, and an internal type converter that performs a type conversion of data stored in the internal memory or data generated by the polymorphic operator array, includes analyzing a first instruction instructing an operation with respect to a first layer of the neural network algorithm from an external device, performing a type conversion of result data of a second layer obtained by performing an operation one layer earlier than the first layer, by one of the type conversion data mover and the internal type converter, performing the operation with respect to the first layer, based on the result data of the second layer, and outputting result data of the first layer including a result of the operation with respect to the first layer.

BRIEF DESCRIPTION OF THE FIGURES

The above and other objects and features of the present disclosure will become apparent by describing in detail embodiments thereof with reference to the accompanying drawings.

FIG. 3 is a schematic diagram for describing an operation of a polymorphic operator array of FIG. 1, according to an embodiment of the present disclosure.

DETAILED DESCRIPTION

Figure 1:
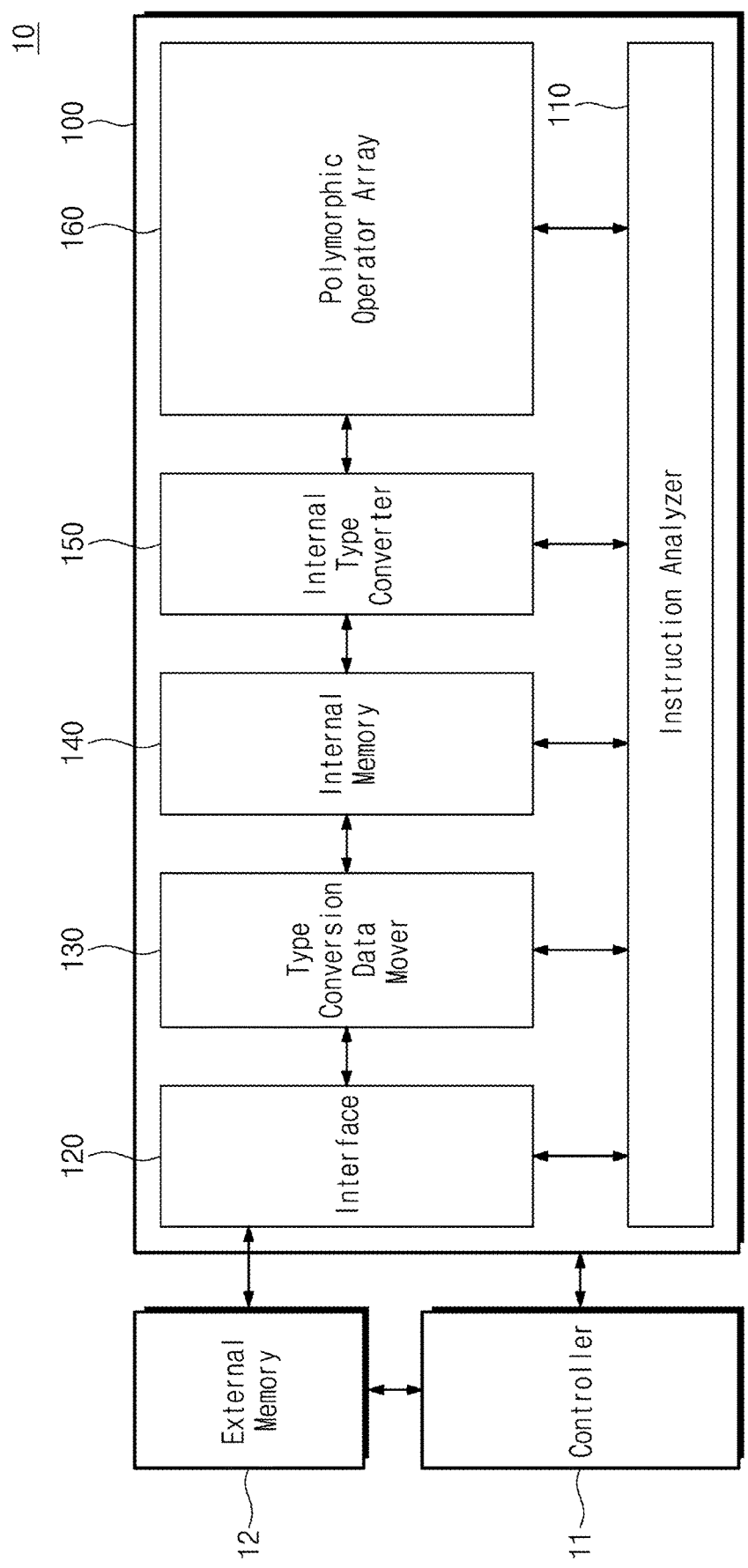
FIG. 1 is a block diagram illustrating a computing device according to an embodiment of the present disclosure.

Hereinafter, embodiments of the present disclosure will be described clearly and in detail such that those skilled in the art may easily carry out the present disclosure.

Hereinafter, some embodiments of the present disclosure will be described in more detail with reference to the accompanying drawings. In describing the present disclosure, similar reference numerals will be used for similar elements in the drawings in order to facilitate an overall understanding, and redundant descriptions for similar elements will be omitted.

FIG. 1 is a block diagram illustrating a computing device 10, according to an embodiment of the present disclosure. Referring to FIG. 1, the computing device 10 may include a controller 11, an external memory 12, and a neural network accelerator 100. In some embodiments, the computing device 10 may be a super computing device used in various fields such as scientific and technological computation. However, the scope of the present disclosure is not limited thereto, and the computing device 10 may include various types of computing devices configured to support various computing functions. For example, the computing device 10 may include various computing devices or information processing devices, such as personal computers, notebook computers, tablets, smartphones, servers, workstations, black boxes, automotive electronic systems, etc.

The controller 11 may control various operations performed within the computing device 10. For example, the controller 11 may determine computation data or a neural network algorithm to be used in the neural network accelerator 100. For another example, the controller 11 may store data in the external memory 12 or may read data stored in the external memory 12.

The external memory 12 may store data under a control of the controller 11 or the neural network accelerator 100. For example, the external memory 12 may store data to be input to the neural network accelerator 100 or data of various parameters generated or updated in a learning process of the neural network accelerator 100. In some embodiments, the external memory 12 may include a dynamic random access memory (DRAM).

The neural network accelerator 100 may learn a neural network model or algorithm under the control of the controller 11 or may perform inference based on the learned neural network model. The neural network accelerator 100 may perform various operations for learning a neural network model or algorithm or may perform various operations for performing inference based on the learned neural network model. In some embodiments, the neural network accelerator 100 may perform a convolution operation based on the operation data, and may store a result of the operation as a result data in an internal memory 140 of the neural network accelerator 100 or the external memory 12.

The neural network accelerator 100 may include an instruction analyzer 110, an interface 120, a type conversion data mover 130, the internal memory 140, an internal type converter 150, and a polymorphic operator array 160.

The instruction analyzer 110 may manage an operation of the neural network accelerator 100. For example, the instruction analyzer 110 may receive an instruction instructing an operation of the neural network accelerator 100 through the interface 120 from the external device (e.g., the controller 11 or the external memory 12). The instruction analyzer 110 may analyze the received instruction, and may control operations of the interface 120, the type conversion data mover 130, the internal memory 140, the internal type converter 150, the polymorphic operator array 160, etc. of the neural network accelerator 100, based on the analyzed instruction. In some embodiments, the instruction analyzer 110 may be referred to as a controller or processor of the neural network accelerator 100.

For example, the instruction analyzer 110 may receive an instruction that is defined (or indicating such an operation method) with respect to a method of operation of a certain layer of the neural network, such as performing matrix operations, adjusting a precision of data, or outputting result data, etc. The instruction analyzer 110 may analyze the received instruction, and in response to the analyzed instruction, may control other components of the neural network accelerator 100.

The interface 120 may communicate with the external device of the neural network accelerator 100. For example, the interface 120 may receive an instruction or operation data to be processed by the neural network accelerator 100 from the external device. The interface 120 may output result data generated by the neural network accelerator 100 to the external device. For example, the interface 120 may store the result data in the external memory 12. In some embodiments, the interface 120 may be implemented with an Advanced eXtensible Interface (AXI) or a Peripheral Component Interconnect Express (PCIe).

The type conversion data mover 130 may receive the operation data for operation (e.g., matrix operation) through the interface 120. The type conversion data mover 130 may store data of the external device received through the interface 120 in the internal memory 140. For example, the type conversion data mover 130 may perform a type conversion (or precision conversion) of data, and store the type converted data in the internal memory 140. In some embodiments, the type conversion data mover 130 may include a direct memory access (DMA) including a type converter. The type conversion data mover 130 will be described in detail later.

The internal memory 140 may store data input from the external device through the interface 120, instructions to be processed by the instruction analyzer 110, result data generated by the polymorphic operator array 160, etc. In some embodiments, the internal memory 140 may be implemented with a DRAM or a static random access memory (SRAM).

The internal type converter 150 may perform a type conversion of data to be input to the polymorphic operator array 160. For example, the internal type converter 150 may convert the precision of operation data stored in the internal memory 140 or result data of a previous layer stored in the internal memory 140. The internal type converter 150 may transfer the type converted data to the polymorphic operator array 160.

The polymorphic operator array 160 may perform various operations with respect to operation data. For example, the polymorphic operator array 160 may perform a parallel operation or a matrix operation with respect to a plurality of operation data. The polymorphic operator array 160 may include an array(s) of a plurality of polymorphic operators for accelerating matrix operations. The polymorphic operator array 160 may store result data generated by the execution of the operations in the internal memory 140 or may transfer the result data to the interface 120 for storage in the external memory 12. The operation of the polymorphic operator array 160 will be described in detail later.

Operation data to be processed by the polymorphic operator array 160 may include input data and kernel data. The input data may include unit image per frame or unit voice matrix data per frame. The kernel data may be specific matrix data having a determined value in the case of a neural network that has finished learning. The polymorphic operator array 160 may process data such as real time images and voices through real time neural network operation with respect to a plurality of input data.

Hereinafter, for a neural network algorithm that is accelerated (or processed) by the neural network accelerator 100, the following premises will be assumed: 1) the neural network algorithm may be composed of multiple layers, and for each layer, a size of the matrix to be computed may be predetermined; 2) for each layer of the neural network algorithm, a value of the kernel data may be determined in advance through learning of the neural network algorithm; and, 3) for each layer of the neural network algorithm, input data may have a predetermined shape and a predetermined range of values such as an image or voice according to an application program.

The neural network algorithm accelerated by the neural network accelerator 100 may include multiple layers. For one layer, the neural network accelerator 100 may receive an instruction instructing the operation of the neural network accelerator 100 from the external device (e.g., the controller 11), may analyze the received instruction, and may perform a matrix operation (e.g., a convolution operation) with respect to the operation data. The neural network accelerator 100 may store a calculation result in the internal memory 140. The neural network accelerator 100 may output the operation result stored in the internal memory 140 to the external device (e.g., the external memory 12 or the controller 11), or may use again for a subsequent layer operation. Thereafter, for the subsequent layer, the neural network accelerator 100 may receive an instruction again, may analyze the received instruction to perform an operation, and store or output a result of the performed operation.

In some embodiments, the precision of data used (or required) in one layer may be different from the precision of data used (or required) in a subsequent layer. The neural network accelerator 100 may support different precision for each layer. For example, the neural network accelerator 100 may independently perform data type conversion on the result data of a previous layer for any one layer, and may perform an operation with respect to the type converted data. In these embodiments, the neural network accelerator 100 may support operations on various data types. The neural network accelerator 100 may be understood as a neural network accelerator supporting multi-precision.

Each layer of the neural network algorithm processed by the neural network accelerator 100 may not need to use the same precision. For this reason, since a single precision is used in all layers, it may not be necessary to perform an operation with the highest precision. Accordingly, the computational efficiency and power efficiency of the neural network accelerator 100 may be improved. Due to this, an occurrence of a black silicon phenomenon or a temperature control impossible phenomenon in the polymorphic operator array 160 may be prevented.

In some embodiments, a timing at which the neural network accelerator 100 performs type conversion may be flexibly changed. For example, the neural network accelerator 100 may perform a type conversion of data in the type conversion data mover 130 between the interface 120 and the internal memory 140, or in the type converter 150 between the internal memory 140 and the polymorphic operator array 160. By properly performing the type conversion, the neural network accelerator 100 may store a relatively small amount of data in the internal memory 140. Accordingly, the capacity of the internal memory 140 may be saved.

In some embodiments, the neural network accelerator 100 may additionally perform the type conversion with respect to the result data generated by the polymorphic operator array 160. The type converted data may be stored in the internal memory 140 or the external memory 12. Accordingly, the capacity of the internal memory 140 or a bandwidth of the interface 120 may be saved.

Figure 2:
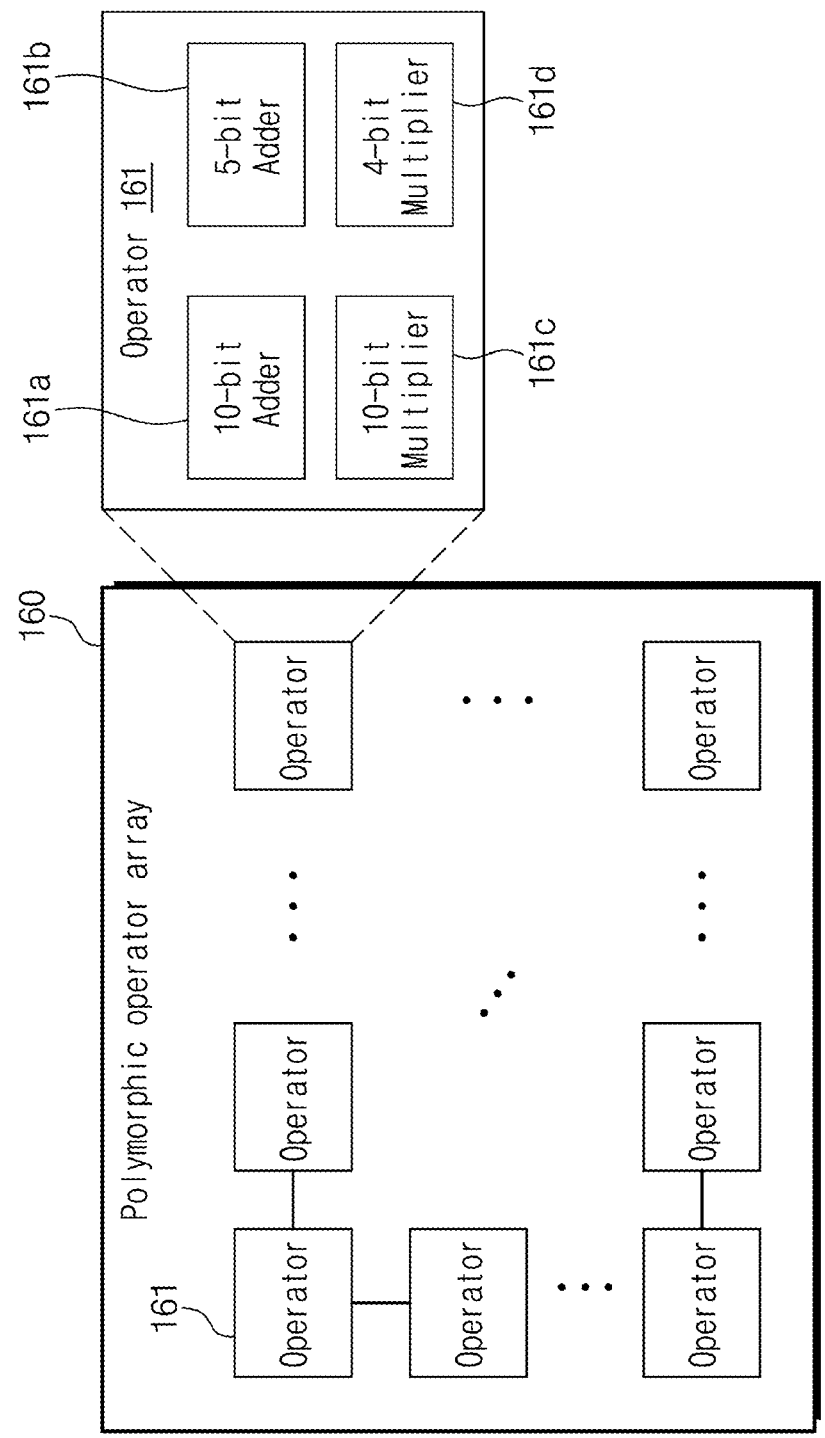
FIG. 2 is a diagram illustrating a polymorphic operator array of FIG. 1 in more detail, according to an embodiment of the present disclosure.

FIG. 2 illustrates the polymorphic operator array 160 of FIG. 1 in more detail, according to an embodiment of the present disclosure. FIG. 3 is a schematic diagram for describing an operation of the polymorphic operator array 160 of FIG. 1 according to an embodiment of the present disclosure. The operation of the polymorphic operator array 160 will be described in detail with reference to FIGS. 1 to 3.

The polymorphic operator array 160 may include a plurality of operators 161. For example, the polymorphic operator array 160 may include an N×N polymorphic operator array including N rows and N columns (where 'N' is a natural number). The operator 161 may include one or more lower operators. For example, the operator 161 may include a 10-bit adder 161a, a 5-bit adder 161b, a 10-bit multiplier 161c, and a 4-bit multiplier 161d. In the embodiment illustrated in FIGS. 2 and 3, the polymorphic operator array 160 including the operator 161 may support five types of operations or five types of data types. However, the number of data types supported by the polymorphic operator array 160 of the present disclosure is not limited to the illustrated embodiment.

Referring to FIG. 3, operations of lower operators of the operator 161 may be determined. In the embodiment of FIG. 3, the polymorphic operator array 160 of the neural network accelerator 100 may support data types of 16-bit floating point FP16, 8-bit floating point HFP8, 2-bit fixed-point INT2, 4-bit fixed-point IN4, and 8-bit fixed-point INT8. For example, on the computing device 10 including the neural network accelerator 100, application programs that process the five types of data described above depending on the layers of the neural network algorithm processed by the neural network accelerator 100 may be driven.

Each data type may be divided into a sign part, an exponent part, and mantissa part. In this case, the sum of the number of bits of the three parts may be the total number of bits of data. In some embodiments, fixed-point data may include the sign part, but may not include the exponent part. The 8-bit floating point may be a newly defined data type that does not conform to IEEE 754 (Institute of Electrical and Electronics Engineers Standard for Floating-Point Arithmetic). Considering that neural network operation does not require high precision of the mantissa part, the 8-bit floating point data may be data in which the mantissa part of 16-bit floating point data is partially or completely removed. Newly devised data types such as the 8-bit floating point may be generated in such a way that an expression range of data is increased but the significant number of data is reduced, by reducing a part occupied by the mantissa part and increasing the exponent part in the data type according to IEEE 754, which is the most existing standard, An 'addition' column and a 'multiplication' column of FIG. 3 may represent the number of bits actually operated when addition operation and multiplication operation are respectively performed for each data type in each operator 161 in the polymorphic operator array 160. In some embodiments, in the case of a fixed-point data type, the number of bits actually operated when addition and multiplication operations are performed may be equal to the total number of bits of data. In contrast, in the case of the floating point data type, when the addition operation is performed, only the addition operation of the mantissa part is performed, and when the multiplication operation is performed, the addition operation of the exponent part and the multiplication operation of the mantissa part may be performed. Accordingly, the total number of bits of the data type may be different from the number of bits actually operated.

According to the number of bits on which the actual operation is performed, in the case of the addition operation, all addition operations between five data types may be performed by using the 10-bit adder 161a and the 5-bit adder 161b. The 5-bit adder 161b may also be used for an addition operation between exponent parts that is performed when a multiplication operation is performed. In the case of a multiplication operation, all multiplication operations between mantissa parts of five data types may be performed by using the 10-bit multiplier 161c and the 4-bit multiplier 161d. As a result, to support the five data types of FIG. 3, when the operator 161 includes the 10-bit adder 161a, the 5-bit adder 161b, the 10-bit multiplier 161c, and the 4-bit multiplier 161d, the area and power efficiency of the polymorphic operator array 160 may be optimized.

To support different precision for each layer, the neural network accelerator 100 may convert a type of operation data or result data. For example, data type conversion may be performed by the type conversion data mover 130 or the internal type converter 150. The execution time and the execution subject of the data type conversion will be described in detail later.

The data type conversion may be possible between all data types supported by the neural network accelerator 100. For example, in the embodiments shown in FIGS. 2 and 3, a total of 20 cases of data type conversion may occur ($_5P_2$). In some embodiments, the data type conversion performed by the neural network accelerator 100 may be different from a type conversion of a general data type. For example, the neural network algorithm does not derive an accurate result value but is an algorithm for screening a candidate with the highest probability, so the data type conversion performed by the neural network accelerator 100 may not aim to preserve significant figures in the algebraic sense themselves.

In the case of type conversion in which the total number of bits of data increases between fixed-point data types, a most significant bit (MSB) may be expanded. For example, when conversion from INT2 type to INT4 type, conversion from INT2 type to INT8 type, or conversion from INT4 type to INT8 type is performed, the upper bit(s) of data may be expanded. Accordingly, there may be no change in the existing data value.

In the case of type conversion in which the total number of bits of data decreases between fixed-point data types, type conversion in which a reference point is moved may be performed. For example, when conversion from INT8 type to INT4 type, conversion from INT4 type to INT2 type, or conversion from INT8 type to INT2 type is performed, the relative difference between the data may not exist (e.g., data may be all converted to infinity, or may be all converted to zero) when the type conversion of general data types is performed. Therefore, when the type conversion is performed, the reference point of the data may be moved.

In the case of type conversion in which the total number of bits of data increases between floating point data types, the upper bits of the mantissa part of the data may be expanded. For example, when conversion from the HFP8 type to the FP16 type is performed, the upper bits of the mantissa part of the data may be expanded.

In the case of type conversion in which the total number of bits of data decreases between floating point data types, the lower bits of the mantissa part of the data may be truncated. For example, when conversion from the FP16 type to the HFP8 type is performed, the lower bits of the mantissa part of the data may be discarded.

When type conversion between a fixed-point data type and a floating point data type is performed, a method of the type conversion may be determined depending on the expression range of data. For example, in the case of type conversion in which the expression range of data is widened (e.g., conversion from INT type to HFP or conversion from INT type to FP), existing data may be maintained. For another example, in the case of type conversion in which the expression range of data decreases (e.g., conversion from FP type to INT type, or conversion from HFP type to INT type), with the goal of maintaining relative differences between data, type conversion may be performed.

Figure 4:
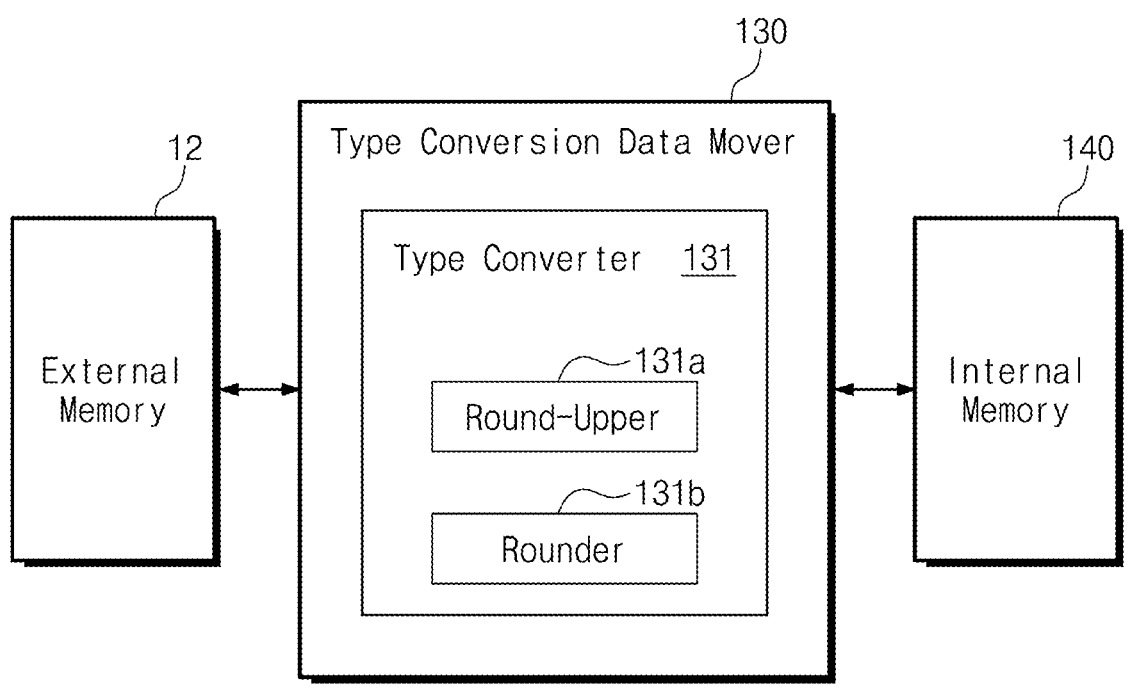
FIG. 4 is a diagram illustrating a type conversion data mover of FIG. 1 in more detail, according to an embodiment of the present disclosure.

FIG. 4 illustrates the type conversion data mover 130 of FIG. 1 in more detail, according to an embodiment of the present disclosure. Referring to FIGS. 1 to 4, the type conversion data mover 130 may include a type converter 131. The type conversion data mover 130 may receive the data stored in the external memory 12 through the interface 120, may selectively perform type conversion on the received data, and may transfer the received data or the type converted data to the internal memory 140. For convenience of illustration, illustration of the interface 120 is omitted.

The type converter 131 may include lower operators for performing type conversion between data types. For example, the type converter 131 may include a round-upper 131a and a rounder 131b. Unlike the illustration, the type converter 131 may further include other lower operators (e.g., a discarder, etc.) for performing conversion between data types described with reference to FIGS. 2 and 3. The type converter 131 may perform the type conversion with respect to data received from the external memory 12 under the control of the instruction analyzer 110 through the lower operators. In some embodiments, the internal type converter 150 may be implemented similarly to the type converter 131 of the type conversion data mover 130, and may operate similarly thereto.

The type conversion data mover 130 may store the data type converted by the type converter 131 in the internal memory 140. Thereafter, the type converted data stored in the internal memory 140 may be provided to the polymorphic operator array 160.

Figure 5:
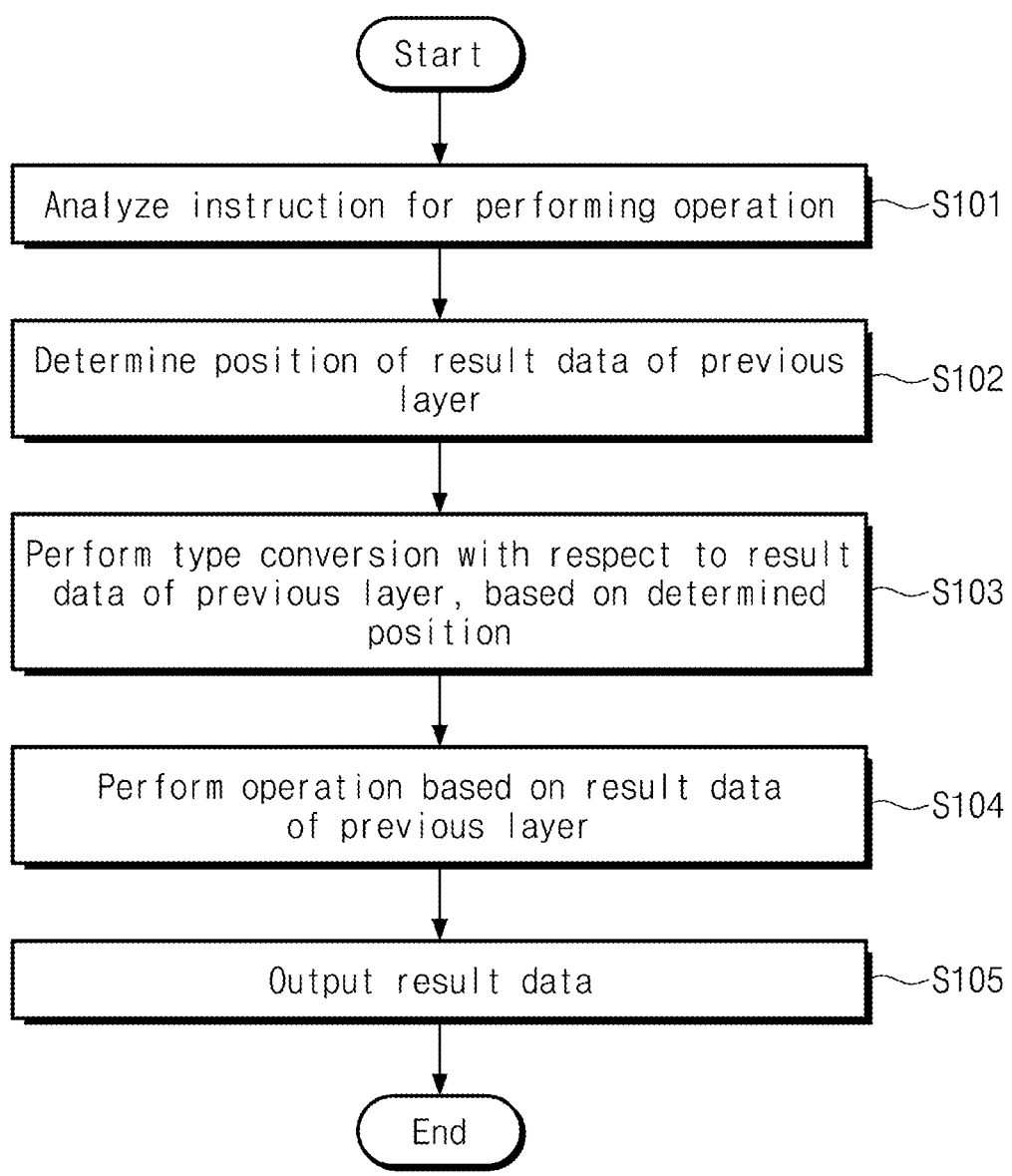
FIG. 5 is a flowchart illustrating an operation method of the neural network accelerator of FIG. 1, according to an embodiment of the present disclosure.

FIG. 5 is a flowchart illustrating a method of operating the neural network accelerator 100 of FIG. 1, according to an embodiment of the present disclosure. Referring to FIGS. 1 and 5, the neural network accelerator 100 may perform operations S101 to S105. Hereinafter, it will be assumed that the data type of each layer of the neural network algorithm calculated by the neural network accelerator 100 is predetermined by the controller 11 or the instruction analyzer 110.

In operation S101, the neural network accelerator 100 may analyze an instruction for performing an operation. For example, the interface 120 of the neural network accelerator 100 may receive an operation instruction instructing an operation to be performed by the polymorphic operator array 160 with respect to the first layer from an external device (e.g., the controller 11). The instruction analyzer 110 may analyze the received operation instruction.

In operation S102, the neural network accelerator 100 may determine a position of the result data of the previous layer. For example, the neural network accelerator 100 may further receive an input instruction instructing input of result data of the second layer. The neural network accelerator 100 may analyze the input instruction, and in response to the analyzed input instruction, may receive, from the external memory 12, the result data of the second layer in which the operation is performed one layer earlier than the first layer, or may load the result data of the second layer from the internal memory 140.

In operation S103, the neural network accelerator 100 may perform the type conversion on the result data of the previous layer based on the position determined in operation S102. For example, in response to that the data type of the first layer is different from the data type of the second layer, type conversion may be performed with respect to the result data of the second layer. The type conversion of the result data of the second layer may be performed by either the type conversion data mover 130 or the internal type converter 150. The subject performing the type conversion of the result data of the second layer may be determined depending on the determination result of operation S102. The type conversion of the result data of the second layer will be described in detail later with reference to FIG. 6.

In operation S104, the neural network accelerator 100 may perform an operation, based on the result data of the previous layer. For example, the polymorphic operator array 160 of the neural network accelerator 100 may perform an operation corresponding to the operation instruction analyzed in operation S101 with respect to the result data of the second layer retrieved in operation S102 or the result data of the second layer type-converted in operation S103.

In operation S105, the neural network accelerator 100 may output result data. For example, in response to the instruction analyzed in operation S101, the neural network accelerator 100 may store the result of the operation performed in operation S104 in the internal memory 140 or the external memory 12 as the result data of the first layer. For another example, the neural network accelerator 100 may receive an output instruction for instructing the output of data, may analyze the output instruction through the instruction analyzer 110, and may store the operation result performed in operation S104 in the internal memory 140 or the external memory 12 as result data of the first layer, in response to the analyzed output instruction.

In some embodiments, the neural network accelerator 100 may perform a type conversion with respect to the result data in response to that a data type of the third layer in which the operation is to be performed one layer later than the first layer, and may store the type converted result data in the internal memory 140 or the external memory 12. The type conversion of the result data of the first layer will be described in detail later with reference to FIG. 7.

Figure 6:
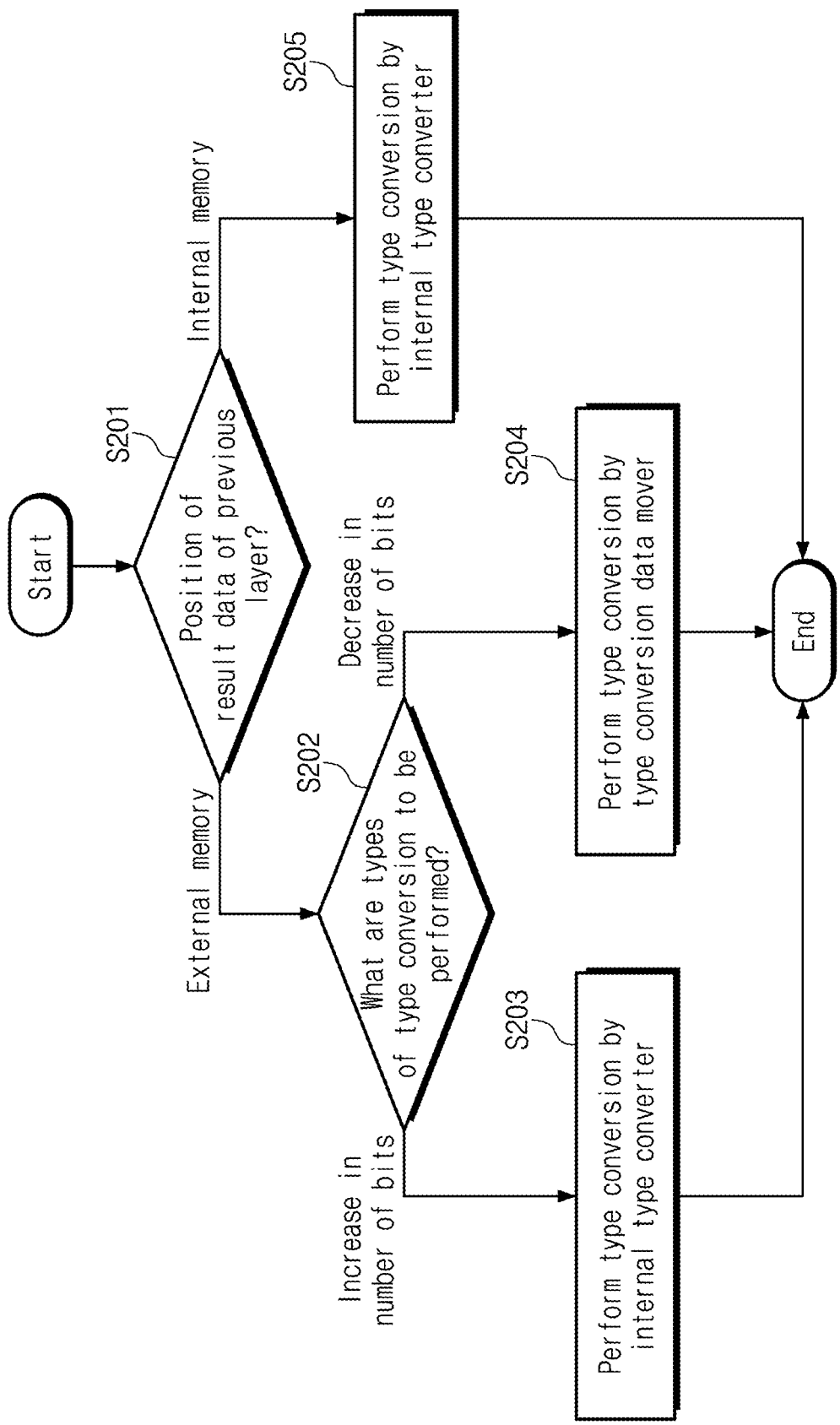
FIG. 6 is a flowchart illustrating an operation method of a neural network accelerator of FIG. 1 in more detail, according to an embodiment of the present disclosure.

FIG. 6 illustrates an operation method of the neural network accelerator 100 of FIG. 1 in more detail, according to an embodiment of the present disclosure. Referring to FIGS. 1, 5, and 6, in response to that the data type of the first layer is different from the data type of the second layer, the neural network accelerator 100 may further perform operations S201 to S205.

In operation S201, the neural network accelerator 100 may determine the position of the result data of the previous layer. For example, the neural network accelerator 100 may perform operation S201 in a manner similar to operation S102. When the result data on the second layer are positioned in the external memory 12, the neural network accelerator 100 may perform operations S202 to S204. When the result data of the second layer are positioned in the internal memory 140, the neural network accelerator 100 may perform operation S205.

In operation S202, the neural network accelerator 100 may determine a type of type conversion to be performed. For example, the instruction analyzer 110 of the neural network accelerator 100 may determine the type of type conversion to be performed with respect to the result data of the second layer by comparing the data type of the first layer with the data type of the second layer.

As another example, the neural network accelerator 100 may receive an instruction instructing the type of type conversion to be performed with respect to the result data of the second layer by the neural network accelerator 100 from an external device. In some embodiments, the instruction instructing the type conversion may be included in the instruction received in operation S101. Based on the instruction instructing the type conversion, the neural network accelerator 100 may determine the type of type conversion.

In response to determining that the type conversion to increase the number of bits of the result data of the second layer should be performed, the neural network accelerator 100 may perform operation S203. For example, in response to that the total number of bits of the data type of the first layer is greater than the total number of bits of the data type of the second layer or the expression range of the data type of the first layer is greater than the expression range of the data type of the second layer, the neural network accelerator 100 may perform operation S203. For another example, in response to determining that a type conversion that increases the total number of bits of the result data of the second layer should be performed or a type conversion that increases the expression range of the result data of the second layer should be performed, the neural network accelerator 100 may perform operation S203.

In operation S203, the type conversion of the result data of the second layer may be performed by the internal type converter 150 of the neural network accelerator 100. For example, the type conversion data mover 130 may store the result data of the second layer stored in the external memory 12 as it is in the internal memory 140. In detail, the type conversion data mover 130 may not perform the type conversion of the result data of the second layer. Thereafter, the type conversion may be performed by the internal type converter 150 with respect to the result data of the second layer stored in the internal memory 140. The result data of the second layer type converted by the internal type converter 150 may be transferred to the polymorphic operator array 160.

As operation S203 is performed, the size of the result data of the second layer stored in the internal memory 140 may be less than the size of the data type-converted by the internal type converter 150. Accordingly, data having a relatively small size may be stored in the internal memory 140, and as a result, the storage capacity of the internal memory 140 may be saved.

In response to determining that the type conversion for reducing the number of bits of the result data of the second layer should be performed, the neural network accelerator 100 may perform operation S204. For example, in response to that the total number of bits of the data type of the first layer is less than the total number of bits of the data type of the second layer, or the expression range of the data type of the first layer is less than the expression range of the data type of the second layer, the neural network accelerator 100 may perform operation S204. For another example, in response to determining that a type conversion that decreases the total number of bits of the result data of the second layer should be performed or a type conversion that decreases the expression range of the result data of the second layer should be performed, the neural network accelerator 100 may perform operation S204.

In operation S204, the type conversion of the result data of the second layer may be performed by the type conversion data mover 130 of the neural network accelerator 100. For example, the type conversion data mover 130 may perform the type conversion with respect to the result data of the second layer stored in the external memory 12. The type conversion data mover 130 may store the type converted result data of the second layer in the internal memory 140. The type converted result data of the second layer stored in the internal memory 140 may be transferred to the polymorphic operator array 160.

As operation S204 is performed, the size of the type converted result data of the second layer stored in the internal memory 140 may be less than the size of the result data of the second layer stored in the external memory 12. Accordingly, data having a relatively small size may be stored in the internal memory 140, and as a result, the storage capacity of the internal memory 140 may be saved.

In operation S205, the internal type converter 150 of the neural network accelerator 100 may perform type conversion with respect to the result data of the second layer. For example, the internal type converter 150 may perform the type conversion with respect to the result data of the second layer stored in the internal memory 140, regardless of types of type conversion. Thereafter, the internal type converter 150 may transfer the type converted data to the polymorphic operator array 160.

In the manner described above, the neural network accelerator 100 may flexibly perform the type conversion of data. For example, the timing at which data type conversion is performed by the neural network accelerator 100 may be flexibly adjusted based on the storage position of the result data of the previous layer and the type of type conversion to be performed. Accordingly, the neural network accelerator 100 may be freely operated for each layer, and the capacity of the internal memory 140 may be saved.

Figure 7:
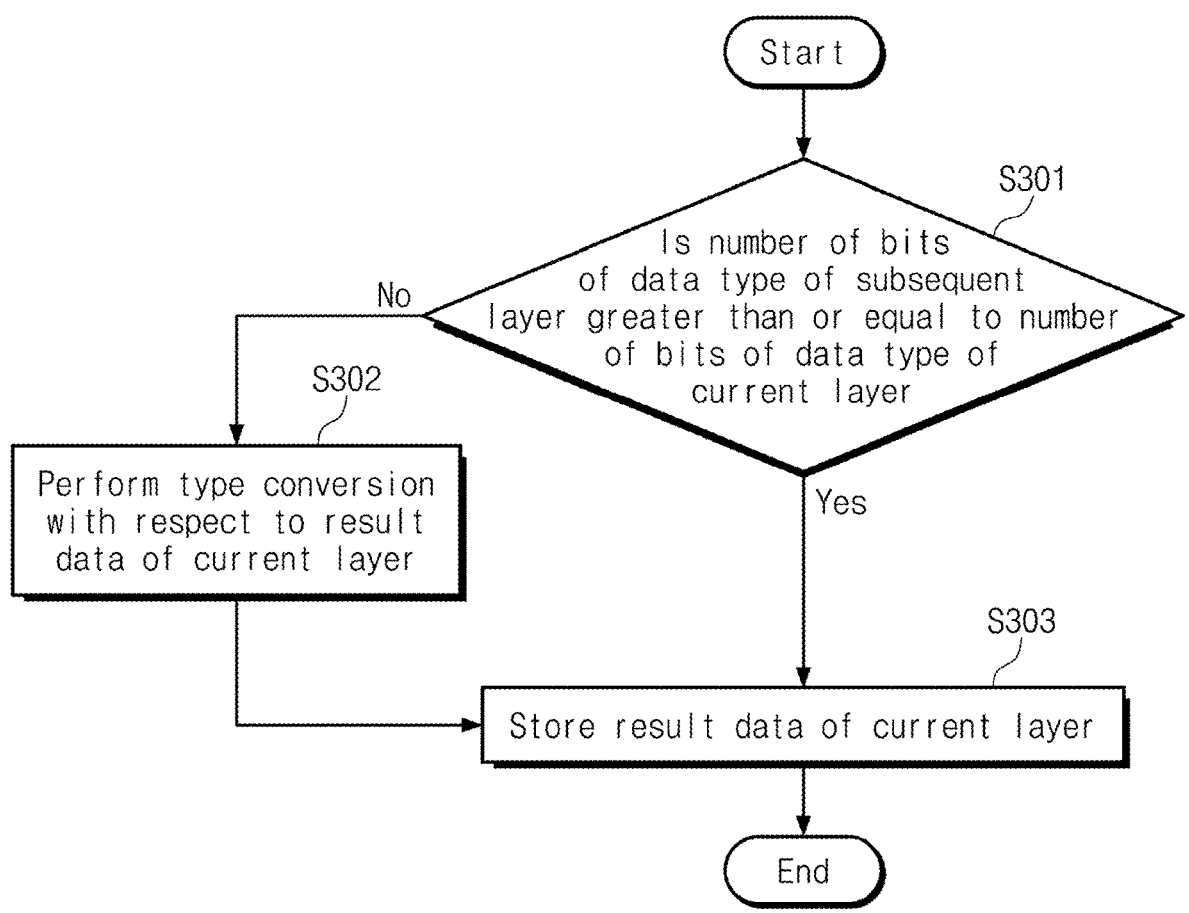
FIG. 7 is a flowchart illustrating an operation method of a neural network accelerator of FIG. 1 in more detail, according to another embodiment of the present disclosure.

FIG. 7 illustrates an operation method of the neural network accelerator 100 of FIG. 1 in more detail, according to another embodiment of the present disclosure. Referring to FIGS. 1, 5, and 7, the neural network accelerator 100 may perform operations S301 to S303. The neural network accelerator 100 may selectively perform type conversion with respect to the result data of the current layer and then store the type converted result data in the internal memory 140 or the external memory 12.

In operation S301, the number of bits of the data type of the subsequent layer may be compared with the number of bits of the data type of the current layer. For example, the instruction analyzer 110 of the neural network accelerator 100 may determine the number of bits of the data type of the third layer, and may compare the total number of bits of the data type of the first layer with the total number of bits of the data type of the third layer.

In some embodiments, the instruction analyzer 110 of the neural network accelerator 100 may determine the number of bits of the data type of the third layer, based on information provided in advance from the controller 11. Alternatively, the neural network accelerator 100 may further receive an instruction including information on the number of bits of the third layer data type from an external device. In some embodiments, such an instruction may be included in the instruction received in operation S101. Based on this instruction, the neural network accelerator 100 may determine the number of bits of the data type of the third layer.

In response to that the number of bits of the data type of the subsequent layer is less than the number of bits of the data type of the current layer, in operation S302, the type conversion may be performed with respect to the result data of the current layer by the neural network accelerator 100. For example, in response to that the number of bits of the data type of the third layer is less than the number of bits of the data type of the first layer, the type conversion may be performed with respect to the result data of the first layer by the internal type converter 150 or the type conversion data mover 130 of the neural network accelerator 100. Thereafter, in operation S303, the type converted result data of the first layer may be stored in the internal memory 140 or the external memory 12. The type converted result data of the first layer may have a smaller capacity than the result data of the first layer. Accordingly, the type converted result data of the first layer may be stored in the internal memory 140 instead of the result data of the first layer or may be stored in the external memory 12 through the interface 120. As a result, the capacity of the internal memory 140 may be saved or a data bandwidth of the interface 120 may be saved.

In response to that the number of bits of the data type of the subsequent layer is greater than the number of bits of the data type of the current layer, in operation S303, the result data of the current layer may be stored by the neural network accelerator 100 without performing the type conversion with respect to the result data of the current layer. For example, in response to that the number of bits of the data type of the third layer is greater than or equal to the number of bits of the data type of the first layer, the neural network accelerator 100 may store the result data of the first layer in the internal memory 140 or the external memory 12 as it is, without performing the type conversion with respect to the result data of the first layer.

In some embodiments, operation S301 may be performed by another component (e.g., the controller 11) of the computing device 10. In these embodiments, the neural network accelerator 100 may receive the output instruction instructing to perform operation S302 in response to that the number of bits of the data type of the subsequent layer is less than the number of bits of the data type of the current layer, or may receive the output instruction instructing to perform operation S303 in response to that the number of bits of the data type of the subsequent layer is greater than or equal to the number of bits of the data type of the current layer. In response to the received output instruction, the neural network accelerator 100 may perform operation S302 or operation S303.

According to an embodiment of the present disclosure, a neural network accelerator may support different precision for each layer of a neural network. Accordingly, the computational efficiency and power efficiency of the neural network accelerator may be improved. Furthermore, the neural network accelerator according to an embodiment of the present disclosure may perform type conversion of data for each layer, and in this case, the timing at which the type conversion is performed may be flexibly adjusted. Accordingly, the capacity of the internal memory of the neural network accelerator may be saved, and the bandwidth of the interface communicating with the external device of the neural network accelerator may be saved.

While the present disclosure has been described with reference to embodiments thereof, it will be apparent to those of ordinary skill in the art that various changes and modifications may be made thereto without departing from the spirit and scope of the present disclosure as set forth in the following claims.

What is claimed is:

1. A neural network accelerator comprising:
an instruction analyzer which analyzes a first instruction instructing an operation with respect to a first layer of a neural network algorithm from an external device;
a polymorphic operator array including a plurality of operators which perform the operation with respect to the first layer under a control of the instruction analyzer;
an interface which communicates with the external device and an external memory under the control of the instruction analyzer;
an internal memory;
a type conversion data mover which stores data received from the external memory through the interface in the internal memory under the control of the instruction analyzer; and
an internal type converter which performs a conversion of data stored in the internal memory or data generated by the polymorphic operator array under the control of the instruction analyzer,
wherein, in response to that result data of a second layer obtained by performing an operation one layer earlier than the first layer are stored in the external memory, the interface reads the result data with respect to the second layer from the external memory and transfers the read result data to the type conversion data mover,
wherein the result data with respect to the second layer include a result of the operation with respect to the second layer, and
wherein, in response to that a total number of bits of a data type requested in the first layer is less than a total number of bits of a data type required in the second layer, the type conversion data mover performs a type conversion of the result data with respect to the second layer and stores the type converted result data with respect to the second layer in the internal memory.

2. The neural network accelerator of claim 1, wherein a first operator of the plurality of operators of the polymorphic operator array includes a 10-bit adder, a 5-bit adder, a 10-bit multiplier, and a 4-bit multiplier.

3. The neural network accelerator of claim 1, wherein, in response to that the total number of bits of the data type requested in the first layer is greater than the total number of bits of the data type required in the second layer, the type conversion data mover stores the result data with respect to the second layer in the internal memory, and
wherein the internal type converter performs a type conversion of the result data with respect to the second layer stored in the internal memory, and transfers the type converted result data with respect to the second layer to the polymorphic operator array.

4. The neural network accelerator of claim 1, wherein, in response to that the result data of the second layer obtained by performing the operation one layer earlier than the first layer are stored in the internal memory, the internal type converter performs a type conversion of the result data with respect to the second layer stored in the internal memory, and transfers the type converted result data with respect to the second layer to the polymorphic operator array, and
wherein the result data with respect to the second layer include a result of the operation with respect to the second layer.

5. The neural network accelerator of claim 1, wherein result data with respect to the first layer are stored in the internal memory or the external memory, in response to that a total number of bits of a data type required in a third layer in which an operation is to be performed one layer later than the first layer is greater than the total number of bits of the data type required in the first layer, and
wherein the result data with respect to the first layer include a result of the operation with respect to the first layer performed by the polymorphic operator array.

6. The neural network accelerator of claim 1, wherein, in response to that a total number of bits of a data type required in a third layer in which an operation is to be performed one layer later than the first layer is less than the total number of bits of the data type required in the first layer, the internal type converter performs a type conversion of result data with respect to the first layer and stores the type converted result data with respect to the first layer in the internal memory, and
wherein the result data with respect to the first layer include a result of the operation with respect to the first layer performed by the polymorphic operator array.

7. The neural network accelerator of claim 1, wherein, in response to that a total number of bits of a data type required in a third layer in which an operation is to be performed one layer later than the first layer is less than the total number of bits of the data type required in the first layer, the type conversion data mover performs a type conversion of result data with respect to the first layer, transfers the type converted result data with respect to the first layer to the interface, and stores the type converted result data with respect to the first layer in the external memory, and
wherein the result data with respect to the first layer include a result of the operation with respect to the first layer performed by the polymorphic operator array.

8. A method of operating a neural network accelerator including a polymorphic operator array which performs operations for processing a neural network algorithm, an internal memory, a type conversion data mover which transfers data stored in an external memory to the internal memory, and an internal type converter which performs a type conversion of data stored in the internal memory or data generated by the polymorphic operator array, the method comprising:
analyzing a first instruction instructing an operation with respect to a first layer of the neural network algorithm from an external device;
performing a type conversion of result data of a second layer obtained by performing an operation one layer earlier than the first layer, by one of the type conversion data mover and the internal type converter;
performing the operation with respect to the first layer, based on the result data of the second layer; and
outputting result data of the first layer including a result of the operation with respect to the first layer,
wherein the outputting of the result data of the first layer includes:
performing the type conversion of the result data with respect to the first layer, in response to that a total number of bits of a data type required in a third layer in which an operation is to be performed one layer later than the first layer is less than a total number of bits of a data type required in the first layer; and storing the type converted result data with respect to the first layer in the internal memory or the external memory, and wherein the result data with respect to the first layer include a result of the operation with respect to the first layer performed by the polymorphic operator array.

9. The method of claim 8, wherein, in response to that the result data of the second layer are stored in the external memory and the total number of bits of the data type required in the first layer is less than a total number of bits of a data type required in the second layer, the type conversion of the result data of the second layer is performed by the type conversion data mover.

10. The method of claim 8, wherein, in response to that the result data of the second layer are stored in the external memory and the total number of bits of the data type required in the first layer is greater than a total number of bits of a data type required in the second layer, the type conversion of the result data of the second layer is performed by the internal type converter.

11. The method of claim 8, wherein, in response to that the result data of the second layer are stored in the internal memory, the type conversion of the result data of the second layer is performed by the internal type converter.

12. The method of claim 8, wherein the outputting of the result data of the first layer includes:

storing the result data with respect to the first layer in the internal memory or the external memory, in response to that the total number of bits of the data type required in the third layer in which the operation is to be performed one layer later than the first layer is greater than the total number of bits of the data type required in the first layer, and wherein the result data with respect to the first layer include a result of the operation with respect to the first layer performed by the polymorphic operator array.

\* \* \* \* \*